(12) United States Patent
Sasaki et al.

(10) Patent No.: US 9,064,767 B2
(45) Date of Patent: Jun. 23, 2015

(54) SOLID STATE IMAGING DEVICE AND METHOD OF MANUFACTURING THE SAME

(75) Inventors: Hiroki Sasaki, Kanagawa (JP); Koichi Kokubun, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 319 days.

(21) Appl. No.: 13/597,686

(22) Filed: Aug. 29, 2012

(65) Prior Publication Data

US 2013/0113964 A1    May 9, 2013

(30) Foreign Application Priority Data

Nov. 7, 2011  (JP) ................................. 2011-242993

(51) Int. Cl.
| | |
|---|---|
| H04N 5/335 | (2011.01) |
| H04N 5/228 | (2006.01) |
| H04N 5/225 | (2006.01) |
| H01L 31/062 | (2012.01) |
| H01L 31/113 | (2006.01) |
| H01L 27/146 | (2006.01) |

(52) U.S. Cl.
CPC ...... H01L 27/14629 (2013.01); H01L 27/1463 (2013.01); H01L 27/1464 (2013.01)

(58) Field of Classification Search
CPC ............ H01L 27/146; H01L 27/14627; H01L 27/14623; H01L 27/1464
USPC .............. 348/222.1, 335, 340, 360, 276, 294; 257/530, 432, 291, 292; 250/208.1
See application file for complete search history.

(56) References Cited

U.S. PATENT DOCUMENTS

| | | | |
|---|---|---|---|
| 6,374,024 B1 * | 4/2002 | Iijima | 385/116 |
| 7,554,160 B2 | 6/2009 | Nakamura | |
| 2003/0146491 A1 * | 8/2003 | Tsuura | 257/530 |
| 2005/0029611 A1 * | 2/2005 | Jang et al. | 257/432 |
| 2005/0092992 A1 * | 5/2005 | Nagata et al. | 257/59 |
| 2007/0291148 A1 * | 12/2007 | Takasu | 348/308 |
| 2008/0061391 A1 * | 3/2008 | Bang | 257/432 |
| 2008/0099804 A1 | 5/2008 | Venezia et al. | |
| 2008/0143868 A1 * | 6/2008 | Tsuchiya et al. | 348/360 |
| 2009/0008735 A1 | 1/2009 | Ogino et al. | |
| 2009/0200665 A1 * | 8/2009 | Jobetto et al. | 257/737 |
| 2010/0127156 A1 * | 5/2010 | Yokogawa | 250/208.1 |
| 2010/0244168 A1 | 9/2010 | Shiozawa et al. | |
| 2010/0282945 A1 | 11/2010 | Yokogawa | |
| 2010/0328587 A1 | 12/2010 | Yamada et al. | |
| 2011/0073976 A1 | 3/2011 | Vaillant | |
| 2011/0242350 A1 * | 10/2011 | Sawayama | 348/222.1 |

FOREIGN PATENT DOCUMENTS

| | | |
|---|---|---|
| JP | 2009-38352 | 2/2009 |
| JP | 2009-88415 | 4/2009 |
| JP | 2010-225944 | 10/2010 |

(Continued)

*Primary Examiner* — Tuan Ho
*Assistant Examiner* — Xi Wang
(74) *Attorney, Agent, or Firm* — Oblon, McClelland, Maier & Neustadt, L.L.P.

(57) ABSTRACT

According to one embodiment, a pixel detecting light having the longest wavelength in a picture element includes a protective film which is disposed on a photodiode at a surface side facing a light incident surface of a semiconductor substrate and a first diffraction grating portion which is disposed on the protective film and where columnar holes penetrating in a thickness direction are two-dimensionally arrayed. Diameter and array period of the holes are selected so that the first diffraction grating portion reflects light transmitting through a filter disposed on the pixel.

20 Claims, 13 Drawing Sheets

(56) References Cited

FOREIGN PATENT DOCUMENTS

| JP | 2010-263158 | 11/2010 |
| JP | 2010-278272 | 12/2010 |
| JP | 2011-13330 | 1/2011 |
| JP | 2011-54983 | 3/2011 |

* cited by examiner

— 330 TO 370 nm PITCH
--- 280 TO 320 nm PITCH
—-— 230 TO 270 m PITCH
······ 180 TO 220 m PITCH

SOLID STATE IMAGING DEVICE AND METHOD OF MANUFACTURING THE SAME

CROSS-REFERENCE TO RELATED APPLICATIONS

This application is based upon and claims the benefit of priority from Japanese Patent Application No. 2011-242993, filed on Nov. 7, 2011; the entire contents of which are incorporated herein by reference.

FIELD

Embodiments disclosed herein relate generally to a solid state imaging device and a method of manufacturing the same.

BACKGROUND

A solid state imaging device is a semiconductor device which includes a plurality of pixels having a photoelectric conversion element and a metal oxide semiconductor (MOS) transistor which selectively reads a signal stored in the photoelectric conversion element on a substrate and further includes a multi-layered wiring layer on an upper portion thereof. The solid state imaging devices have been used for, for example, a video camera, a digital still camera, or the like. Among the solid state imaging devices, a CMOS-type solid state imaging device manufactured in a complementary MOS (CMOS) process has merits in terms of low voltage and low power consumption. The CMOS-type solid state imaging device has attracted attention as an imaging device for a camera for a mobile phone, a digital still camera, a digital video camera, and the like.

In the solid state imaging device of the related art, light is incident from a multi-layered wiring layer side, and thus, the light is blocked by the multi-layered wiring layer or the like, so that sufficient light collection characteristic cannot be obtained. Therefore, recently, a rear surface incidence type solid state imaging device where light is incident from a rear surface side of a substrate and is photoelectrically converted in an inner portion of the substrate has been manufactured.

As an image quality of a camera is demanded to be improved, implementation of high pixel density and high sensitivity of the solid state imaging device have been tried by scaling a pixel portion which is a light receiving portion while maintaining a chip area so as to increase the number of pixels. In the current state, in a rear surface illumination type solid state imaging device, although the downsizing proceeds to a degree that the unit pixel pitch becomes 1.4 μm, in order to maintain an absorption sensitivity for red light from an optical absorption coefficient of silicon, a thickness of the solid state imaging device is not less than about 3 μm, so that the downsizing proceeds only in the plane direction but the downsizing does not almost proceed in the thickness direction. Since the downsizing does not proceed in the thickness direction, there are several problems of color mixing due to intrusion of red light into neighboring pixels, requirements of high acceleration implantation for formation of an element isolation portion having a depth of 3 μm, and the like.

Therefore, as a method of implementing the downsizing in the thickness direction in the rear surface illumination type solid state imaging device, a technique has been proposed where light incident on the photoelectric conversion element is reflected and the light is returned to the photoelectric conversion element to be used again, so that the thickness of the photoelectric conversion element is reduced by half. As a method of reflecting the light, for example, a metal film may be disposed on a bottom of an interlayer film of a multi-layered wiring layer. However, since a pixel portion of the solid state imaging device is very vulnerable to metal contamination, in a case where a metal layer is disposed directly on the pixels without an interlayer film interposed, fixed pattern noise due to metal contamination may be increased.

In addition, as another method of reflecting the light, a photonic filter referred to as a guided-mode resonance grating, which reflects only a resonance wavelength by using a difference in refractive index between materials and a fine grating structure, may be disposed on the photoelectric conversion element which is a light receiving portion. However, in this case, fixed pattern noise may be increased by damage due to reactive ion etching (RIE) during the formation of the guided-mode resonance grating on a surface of the light receiving portion.

DETAILED DESCRIPTION

In general, according to one embodiment, provided is a solid state imaging device where picture elements are two-dimensionally arrayed at a predetermined period on a semiconductor substrate. The picture element includes a plurality of pixels including a filter which transmits light having a predetermined wavelength and a photodiode which detects the light having a predetermined wavelength transmitting through the filter so as to detect light having different wavelengths. A pixel which detects light having the longest wavelength in the picture element includes a protective film which is disposed on the photodiode at the side of the surface facing the light incident surface of the semiconductor substrate and a first diffraction grating portion which is disposed on the protective film and where columnar holes penetrating in the thickness direction are two-dimensionally arrayed. In the first diffraction grating portion, a diameter of the hole and an array period of the holes are selected so that the light transmitting through the filter disposed on the pixel which detects light having the longest wavelength in the picture element is reflected.

Hereinafter, solid state imaging devices and methods of manufacturing solid state imaging devices according to embodiments will be described in detail with reference to the attached drawings. In addition, the present invention is not limited to the embodiments. In addition, cross-sectional diagrams of a solid state imaging device used in the embodiments described hereinafter are schematically illustrated, and in some cases, relationship between thickness and width of a layer, a ratio of thickness of each layer, and the like are different from those of actual cases.

First Embodiment

Figure 1:
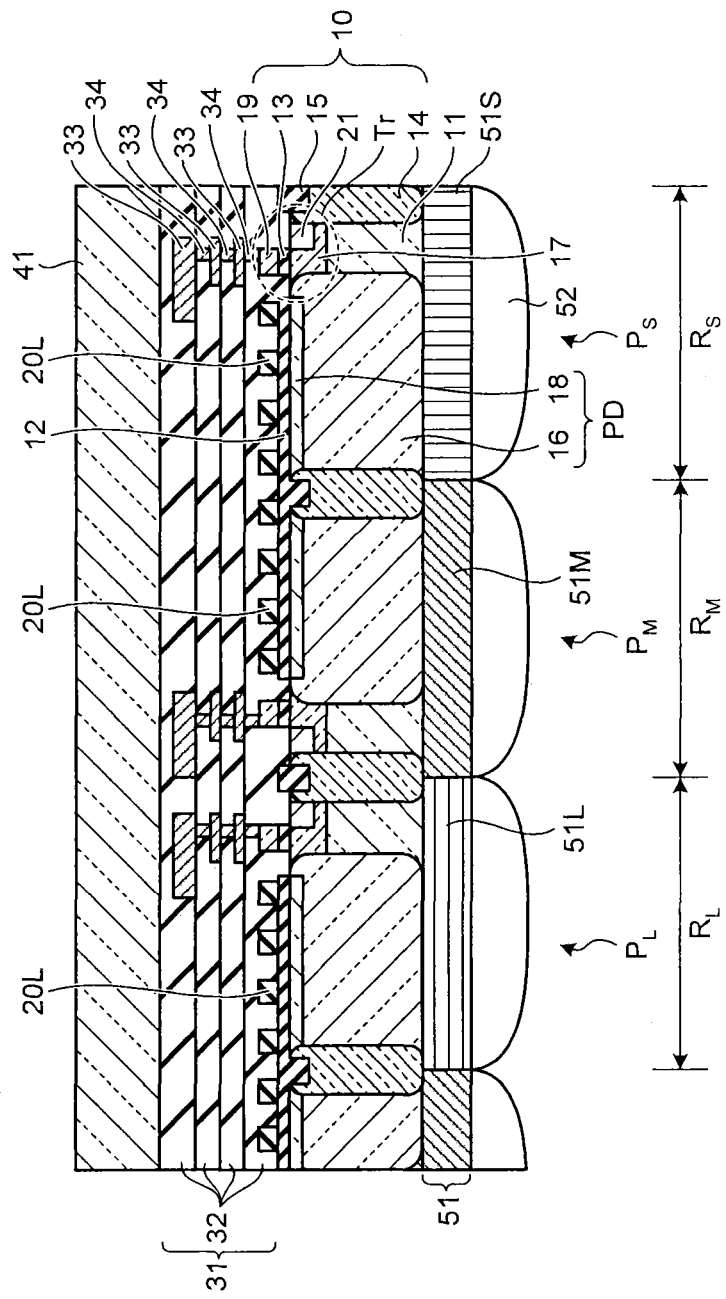
FIG. 1 is a schematic cross-sectional diagram illustrating a configuration of a solid state imaging device according to a first embodiment.

FIG. 1 is a schematic cross-sectional diagram illustrating a configuration of a solid state imaging device according to a first embodiment. The solid state imaging device includes a pixel formation portion 10 where pixels $P_L$, $P_M$, and $P_S$ having a photoelectric conversion element and an element reading a signal of the photoelectric conversion element are formed, a multi-layered wiring layer 31 where wiring layers connected to the elements formed in the pixel formation portion 10 are formed, a supporting substrate 41 which supports the pixel formation portion 10 and the multi-layered wiring layer 31, color filters 51 which limit wavelength of light incident on the respective pixels of the pixel formation portion 10, and microlenses 52 which are disposed with respect to the pixels $P_L$, $P_M$, and $P_S$.

The pixel formation portion 10 is configured with a P-type single crystal silicon substrate 11 where the pixels $P_L$, $P_M$, and $P_S$ are formed. A pixel isolation portion 14 which is configured with a P-type diffusion layer isolating (insulating) the pixel areas $R_L$, $R_M$, and $R_S$ where the pixels are formed is disposed in the P-type single crystal silicon substrate 11. In addition, an element isolation insulating film 15 which is made of, for example, a silicon oxide film or the like is formed in an upper portion of the pixel isolation portion 14. Photodiodes PD as the photoelectric conversion elements which detect light incident through the microlenses 52 and the color filters 51 and read transistors Tr which read charges stored in the photodiodes PD are disposed in areas partitioned by the pixel isolation portion 14.

The photodiode PD has a structure where a charge storage layer 18 which is made of a P-type diffusion layer is disposed in an upper portion of an N-type diffusion layer 16 formed down to a predetermined depth in a portion of the area partitioned by the pixel isolation portion 14 and a PN junction surface is formed substantially parallel to the surface of the substrate. In addition, the depth of the N-type diffusion layer 16 is substantially equal to the thickness of the P-type single crystal silicon substrate 11.

The read transistor Tr is a field effect transistor which is disposed in a P-type well 17 formed in an area adjacent to the N-type diffusion layer 16 in each of the pixel areas $R_L$, $R_M$, and $R_S$ partitioned by the pixel isolation portion 14. In other words, the read transistor Tr has a gate electrode 19 through a gate insulating film 13 in a predetermined area on the P-type well 17. At this time, the photodiode PD is disposed in the one side in the gate length direction of the gate electrode 19, and a source/drain area 21 which is made of an N-type diffusion layer is formed in the other side.

A diffraction grating portion 20L which is configured with a guided-mode resonance grating is disposed through a protective film 12 on the photodiode PD. The protective film 12, for example, is configured with a silicon oxide film having a thickness of from about 2 nm to about 10 nm. The diffraction grating portion 20L is configured with a material (diffraction grating constituent material) having a refractive index higher than that of the protective film 12 and having a low optical absorption coefficient excluding a metallic material. For example, polycrystal silicon, $TiO_2$, $Ta_2O_5$, or the like may be used as the diffraction grating constituent material. In addition, in a case where polycrystal silicon is used for the diffraction grating portion 20L, since the refractive index can be changed by changing a diameter, the diameter may be controlled so that the refractive index of the polycrystal silicon is higher than that of the protective film 12.

In FIG. 1, a first pixel $P_L$ which detects first light having a relatively long wavelength in the visible light range, a second pixel $P_M$ which detects second light having a wavelength shorter than that of the first light in the visible light range, and a third pixel $P_S$ which detects third light having a wavelength shorter than those of the first and second light in the visible light range constitute one picture element which is a minimum unit for forming an image. Therefore, with respect to the color filters 51, a color filter 51L which transmits only the first light is disposed on the first pixel $P_L$; a color filter 51M which transmits only the second light is disposed on the second pixel $P_M$; and a color filter 51S which transmits only the third light is disposed on the third pixel $P_S$.

For example, three primary colors of red (R), green (G), and blue (B) may be used as the first to third light. In this case, three color filters, that is, red, green, and blue filters are used as the color filters 51L, 51M, and 51S. In addition, for example, three colors of yellow (Y), magenta (M), and cyan (C) may also be used as the first to third light. In addition, the microlenses 52 which collect light into the pixel areas $R_L$, $R_M$, and $R_S$ are disposed on the pixel areas $R_L$, $R_M$, and $R_S$. In addition, although not illustrated, the picture elements are two-dimensionally arrayed at a predetermined period on the P-type single crystal silicon substrate 11.

The multi-layered wiring layer 31 is formed on a surface of the P-type single crystal silicon substrate 11 where the diffraction grating portion 20L is formed. The multi-layered wiring layer 31 includes interlayer insulating films 32, wiring layers 33 disposed on the interlayer insulating films 32, and vias 34 disposed for connection between the upper and lower wiring layers 33 or between a gate electrode 19 or a source/drain area 21 of the lower-layer read transistor Tr and the upper wiring layer 33. The read transistor Tr and a not-illustrated peripheral circuit are connected to each other through the multi-layered wiring layer 31. The supporting substrate 41 which is configured with a silicon substrate or the like is further disposed on the multi-layered wiring layer 31. The supporting substrate 41 is disposed in order to maintain the strength of the P-type single crystal silicon substrate 11 when the P-type single crystal silicon substrate 11 is polished so that light is allowed to be incident from the rear surface of the P-type single crystal silicon substrate 11.

The diffraction grating portion 20L has a structure where, for example, columnar penetrating holes are formed in a predetermined rule (for example, a triangular lattice shape or a square lattice shape) in the diffraction grating constituent material and has a function of reflecting light incident through the microlens 52 and the color filter 51 of the rear surface of the solid state imaging device. The wavelength of light which can be reflected by the diffraction grating portion 20L may be changed by changing, for example, a pitch of columnar penetrating holes or a diameter of the columnar penetrating hole. In addition, in this specification, the columnar penetrating hole includes a truncated conic penetrating hole and a penetrating hole having a columnar shape up to the middle portion of the hole and a truncated conic shape from the middle portion thereof as well as columnar penetrating hole.

In general, as a wavelength is increased, light propagating through an inner portion of a material is difficult to be absorbed. Therefore, the thickness of the P-type single crystal silicon substrate 11 is determined so as to absorb an amount of the first light enough to form an image in the photodiode PD. For example, in a case where three colors of red, green, and blue are used as the first to third light, the thickness where the intensities of light fall down to 1/e is 3.5 μm, 1 μm, and 150 nm, respectively. Therefore, preferably, at least the diffraction grating portion 20L is disposed to reflect the first light to the first pixel area $R_L$ which detects the first light which is the most difficult to be absorbed among the first to third light. Accordingly, in the first pixel area $R_L$, since the first light is reflected by the diffraction grating portion 20L, although the thickness of the P-type single crystal silicon substrate 11 is allowed to be thin, the optical length of the first light can be increased. For example, in the case where the first light is red light, in order for the first light to propagate through the P-type single crystal silicon substrate 11 by 3.5 μm, due to the existence of the diffraction grating portion 20L, the thickness of the P-type single crystal silicon substrate 11 can be decreased down to 1.75 μm, that is, a half thereof.

In addition, although the thickness of the P-type single crystal silicon substrate 11 is allowed to be thin, since sufficient amounts of the second light and the third light are absorbed by the thickness of the photodiodes PD, the diffraction grating portion 20L may not be disposed on the photodiodes PD of the second and third pixel areas $R_M$ and $R_S$. However, as illustrated in FIG. 1, columnar penetrating holes having the same pitch and diameter as those of the first pixel area $R_L$ are formed through the protective film 12 on the photodiodes PD of the second and third pixel areas $R_M$ and $R_S$, so that the number of manufacturing processes is not increased and the manufacturing process can be simplified.

Now, operations of the solid state imaging device having the aforementioned structure are described in brief. Light is incident from the microlenses 52 at the rear surface side of the P-type single crystal silicon substrate 11, and the wavelength of the light reaching the pixel areas $R_L$, $R_M$, and $R_S$ is selected by the color filters 51L, 51M, and 51S. In other words, in the first, second, and third pixel areas $R_L$, $R_M$, and $R_S$, only the respective first, second, and third light are selected. The light incident on the pixel areas $R_L$, $R_M$, and $R_S$ is absorbed by the photodiodes PD to be photoelectrically converted, so that carriers which are to be signal charges are stored. The storage of the signal charges is controlled by the read transistor Tr and read by the not-illustrated peripheral circuit.

During the photoelectric conversion of the photodiode PD, in the first pixel area $R_L$, a portion of the first light is not absorbed by the photodiode PD, but the portion of the first light reaches the protective film 12 and is reflected by the diffraction grating portion 20L, where the diameter and period of the columnar hole are optimized so as to reflect the first light, to propagate through the photodiode PD again. Therefore, during the propagation of the first light in the P-type single crystal silicon substrate 11, the first light is photoelectrically converted by the photodiode PD, so that sufficient signal charges can be acquired. In addition, in the second and third pixel areas $R_M$ and $R_S$, the second and third light are absorbed by the photodiode PD to a degree that sufficient signal charges can be obtained until the second and third light reach the protective film 12, and the second and third light are photoelectrically converted. Next, the second and third light which is not absorbed by the photodiode PDs transmit from the protective film 12 to the multi-layered wiring layer 31 side.

Now, a method of manufacturing the solid state imaging device having the aforementioned structure will be described. FIGS. 2A to 2I are schematic cross-sectional diagrams illustrating an example of a procedure of a method of manufacturing the solid state imaging device according to the first embodiment.

Figure 2A:
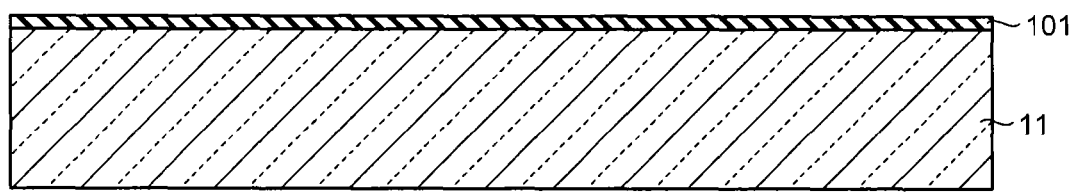
FIGS. 2A to 2I are schematic cross-sectional diagrams illustrating an example of a procedure of a method of manufacturing the solid state imaging device according to the first embodiment.
Figure 2B:
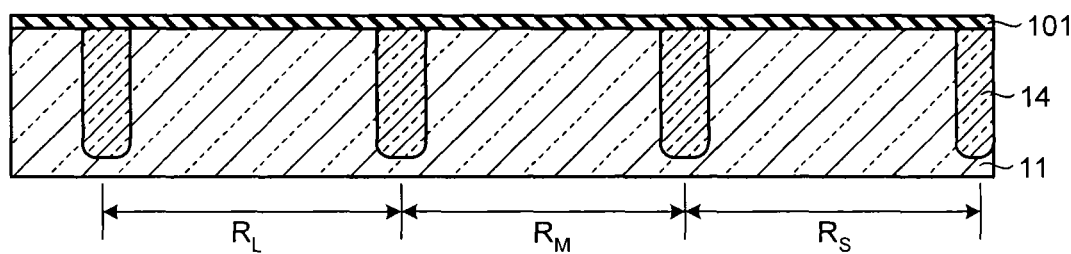

First, as illustrated in FIG. 2A, the P-type single crystal silicon substrate 11 (hereinafter, simply referred to as a substrate) is prepared, and a pad oxide film 101 is formed on the one main surface of the substrate 11 by using thermal oxidation. Next, as illustrated in FIG. 2B, the pixel isolation portion 14 which is made of a P-type diffusion layer is formed by implanting P-type impurities such as B according to an ion implantation method in a boundary of each of the pixel areas $R_L$, $R_M$, and $R_S$. Therefore, the first pixel area $R_L$ which detects the first light, the second pixel area $R_M$ which detects the second light, and the third pixel area $R_S$ which detects the third light are formed on the substrate 11.

Figure 2C:
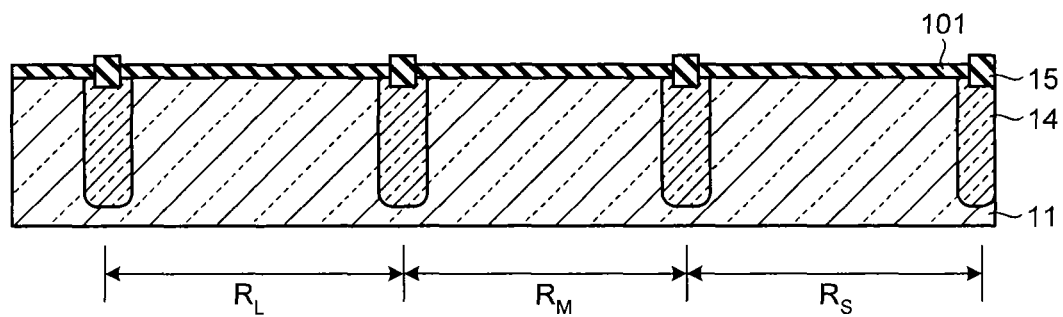

Next, a not-illustrated silicon nitride film is formed on the pad oxide film 101, and after the silicon nitride film is processed by using a lithography technique and an etching technique so that an area where the element isolation insulating film 15 is to be formed is opened, thermal oxidation is performed and the silicon nitride film is removed. Therefore, as illustrated in FIG. 2C, the element isolation insulating film 15 which is thicker than the pad oxide film 101 is formed on the pixel isolation portion 14.

Figure 2D:
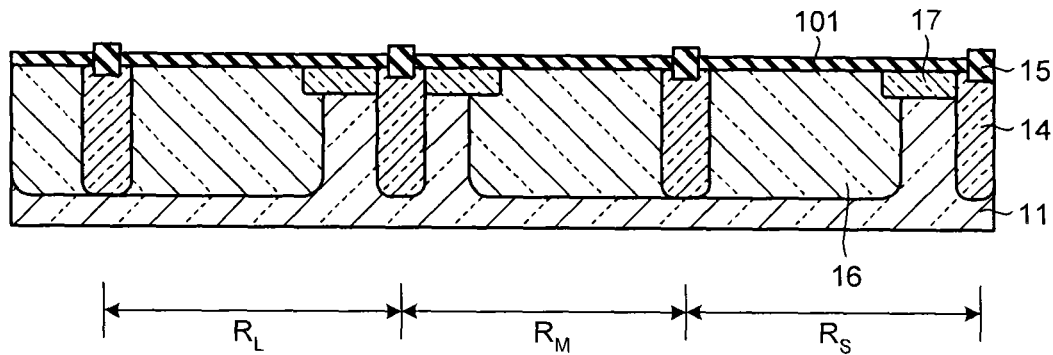
Figure 2E:
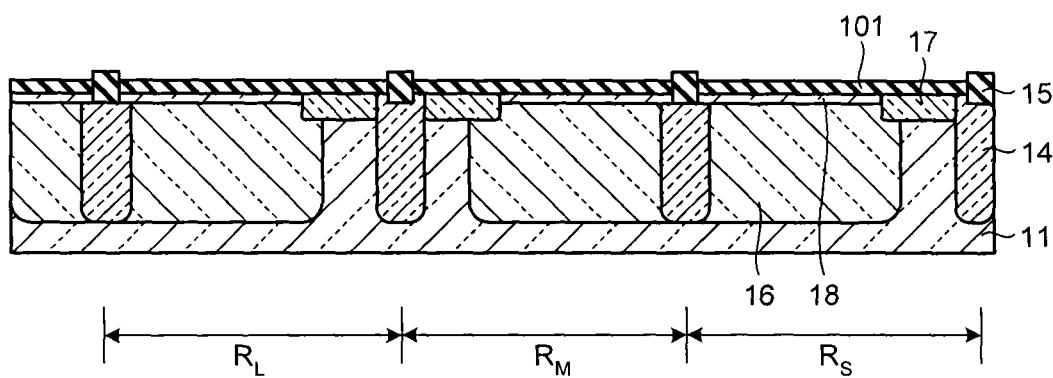

Next, as illustrated in FIG. 2D, the N-type diffusion layer 16 is formed by implanting N-type impurities such as P in an area where the photodiode PD in each of the pixel areas $R_L$, $R_M$, and $R_S$ is to be formed, and the P-type well 17 which is made of a P-type diffusion layer is formed by implanting P-type impurities such as B in an area where the read transistor Tr is to be formed. In addition, the bottom of the N-type diffusion layer 16 is formed so as to be the same as the bottom of the P-type diffusion layer constituting the pixel isolation portion 14, and the P-type well 17 is formed in an area which is shallower than the N-type diffusion layer 16. Next, as illustrated in FIG. 2E, the charge storage layer 18 which is made of a P-type diffusion layer is formed by implanting P-type impurities such as B in the shallow area of the upper portion of the N-type diffusion layer 16.

Figure 2F:
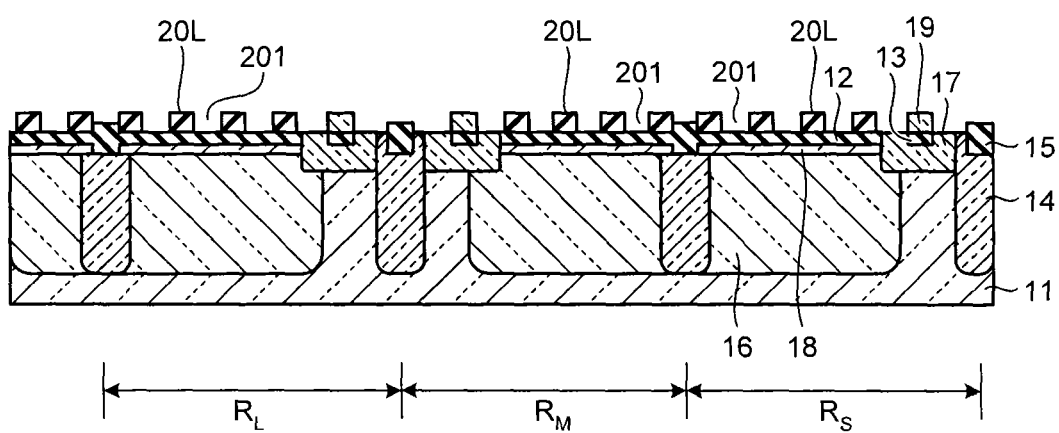

Next, as illustrated in FIG. 2F, for example, a not-illustrated silicon nitride film is formed on the substrate 11, and after the silicon nitride film is processed by using a lithography technique and an etching technique so that an area where the P-type well 17 is to be formed is opened, the pad oxide film 101 on the P-type well 17 is removed by using, for example, hydrofluoric acid. Therefore, the pad oxide film 101 remaining on the photodiode PD becomes the protective film 12.

Next, a gate insulating film 13 is formed on the P-type well 17 by using a method such as thermal oxidation. In addition, for example, a polycrystal silicon film is formed on the substrate 11 where the gate insulating film 13 is formed, and the polycrystal silicon film and the gate insulating film 13 are patterned in a predetermined shape by using a lithography technique and an etching technique. Therefore, a stacked structure of the gate insulating film 13 and the gate electrode 19 is formed.

Next, after a not-illustrated silicon nitride film is removed by using hot phosphoric acid or the like, a diffraction grating constituent material is formed. As described above, a polycrystal silicon film, a $TiO_2$ film, a $Ta_2O_5$ film or the like may be used as the diffraction grating constituent material. Next, the columnar penetrating holes 201 are formed by using a lithography technique and an etching technique such as an RIE method at a predetermined period which is optimized so as to reflect the first light to the diffraction grating constituent material of the first pixel area $R_L$, so that the diffraction grating portion 20L is formed. At this time, the columnar penetrating holes 201 may also be formed in the second and third pixel areas $R_M$ and $R_S$ in the same predetermined period as that of the columnar penetrating holes 201 formed in the first pixel area $R_L$. In addition, when the diffraction grating portion 20L is formed by using an etching technique, since the diffraction grating constituent material is formed on the photodiode PD through the protective film 12, the photodiode PD is not damaged by etching.

Figure 2G:
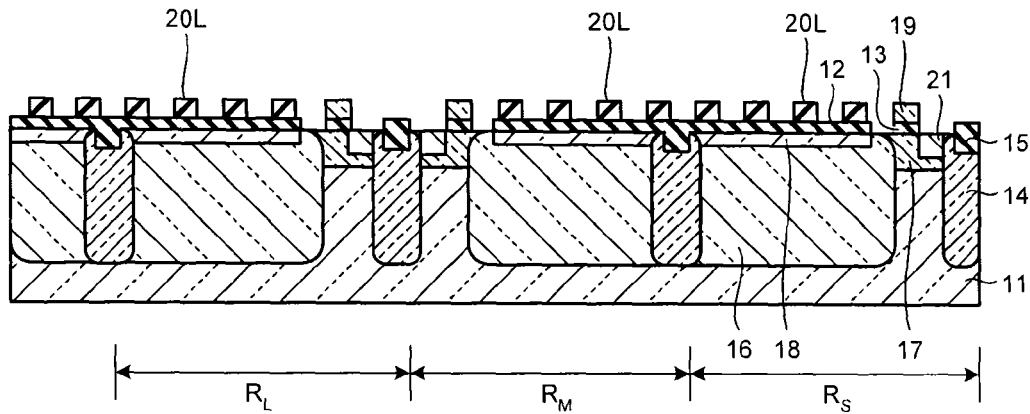

Next, as illustrated in FIG. 2G, the source/drain area 21 of the read transistor Tr which is made of an N-type diffusion layer is formed by implanting N-type impurities such as P according to an ion implantation method in an area interposed between the gate electrode 19 and the pixel isolation portion 14.

Figure 2H:
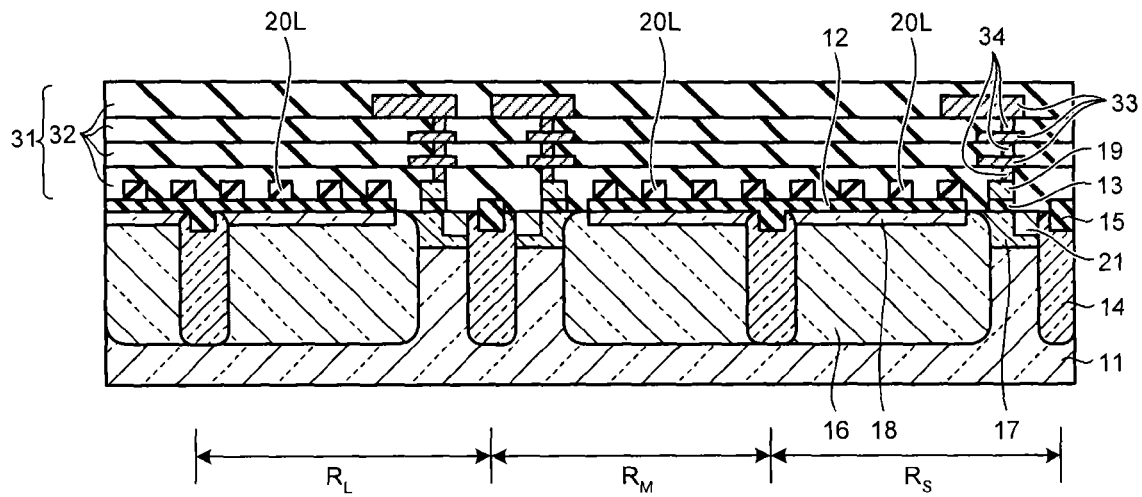

Next, after a not-illustrated peripheral circuit is formed, as illustrated in FIG. 2H, the multi-layered wiring layer 31 is formed on the substrate 11 where the diffraction grating portion 20L and the read transistor Tr are formed. The multi-layered wiring layer 31 has a structure where a plurality of the wiring layers 33 are stacked through the interlayer insulating films 32. Connection between the lowermost-layer wiring layer 33 and the elements on the substrate 11 such as the read transistor Tr and connection between the wiring layers 33 are formed by the vias 34.

Figure 2I:
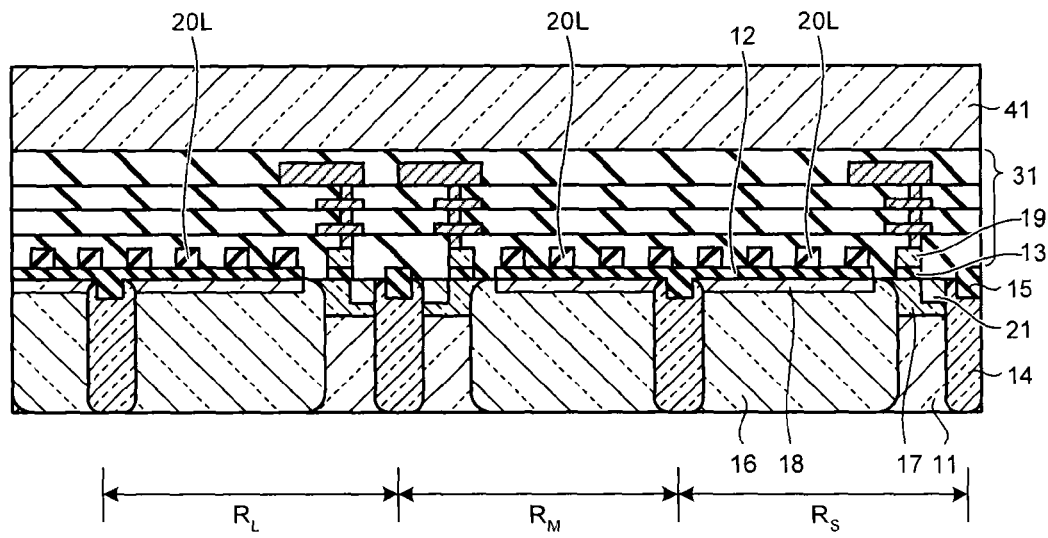

Next, as illustrated in FIG. 2I, after the uppermost-layer interlayer insulating film 32 of the multi-layered wiring layer 31 is planarized by using a chemical mechanical polishing (CMP) method or the like, the supporting substrate 41 such as a silicon substrate is adhered through an adhesive layer. Next, grinding is performed on the rear surface side of the substrate 11 until the substrate 11 has a predetermined thickness. Herein, the grinding is performed until the N-type diffusion layer 16 is exposed.

Next, the color filters 51L, 51M, and 51S transmitting only the respective light having predetermined wavelength are formed on the pixel areas $R_L$, $R_M$, and $R_S$, and the microlenses 52 are further formed thereon, so that the solid state imaging device having the structure illustrated in FIG. 1 can be obtained.

In addition, in FIG. 2F, in a case where polycrystal silicon is used as the diffraction grating constituent material, the gate electrode 19 and the diffraction grating constituent material may be formed by using the same material. In addition, in this case, the diffraction grating portion 20L and the gate electrode 19 can be processed collectively.

In the first embodiment, the diffraction grating portion 20L is formed through the protective film 12 on the photodiode PD of the first pixel area $R_L$ which detects the first light having the longest wavelength among the detected light, so that the first light which is difficult to be absorbed in the photodiode PD can be reflected. As a result, the thickness of the substrate 11 is allowed to be ½ of the optical length in which detection can be made by the photodiode PD, so that it is possible to prevent light receiving sensitivity of the first light from deteriorating. In addition, since the diffraction grating portion 20L is configured with not a metal material but a semiconductor material, an insulating material, or the like, there is no problem in that the photodiode PD is contaminated by metals. In addition, since the diffraction grating portion 20L is formed through the protective film 12 on the photodiode PD, the photodiode PD is suppressed from being damaged by etching during the formation of the diffraction grating portion 20L, so that it is possible to obtain an effect in that fixed pattern noise is suppressed from occurring in the photodiode PD. In addition, in the case where all the diffraction grating portions in the pixel areas $R_L$, $R_M$, and $R_S$ have the same structure as that of the diffraction grating portion 20L, there is an advantage in that a margin of the lithography is enlarged during the formation of the grating structure of the diffraction grating portion 20L.

Second Embodiment

Figure 3:
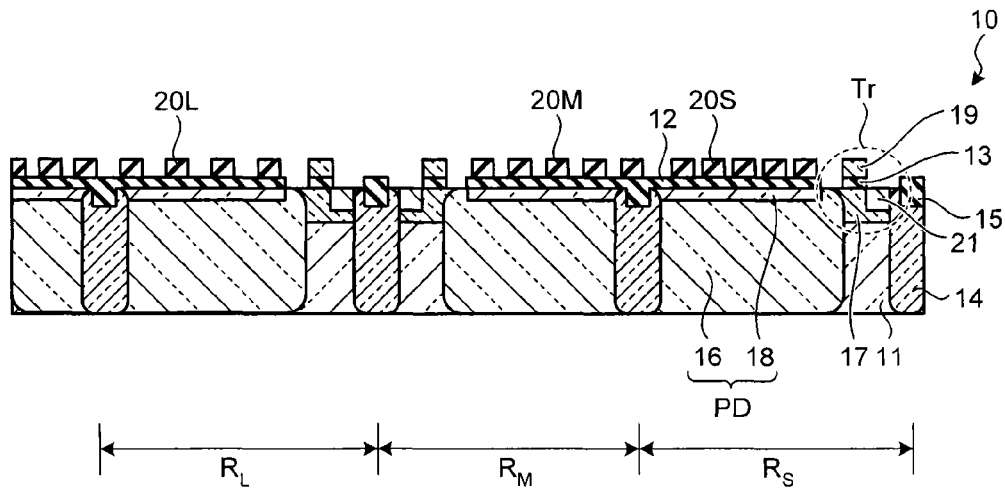
FIG. 3 is a schematic cross-sectional diagram illustrating a configuration of a pixel formation portion of a solid state imaging device according to a second embodiment.

FIG. 3 is a schematic cross-sectional diagram illustrating a configuration of a pixel formation portion of a solid state imaging device according to a second embodiment. In the first embodiment, the diffraction grating portion 20L which is configured so as to reflect the first light having a long wavelength is disposed at least on the photodiode PD of the first pixel area $R_L$. However, in the second embodiment, diffraction grating portions 20L, 20M, and 20S which are configured so as to reflect light incident on the pixel areas $R_L$, $R_M$, and $R_S$ are disposed on the photodiodes PD of the pixel areas $R_L$, $R_M$, and $R_S$. In other words, the diffraction grating portion 20L which is configured so as to reflect the first light is disposed in the first pixel area $R_L$; the diffraction grating portion 20M which is configured so as to reflect the second light is disposed in the second pixel area $R_M$; and the diffraction grating portion 20S which is configured so as to reflect the third light is disposed in the third pixel area $R_S$.

Figure 4:
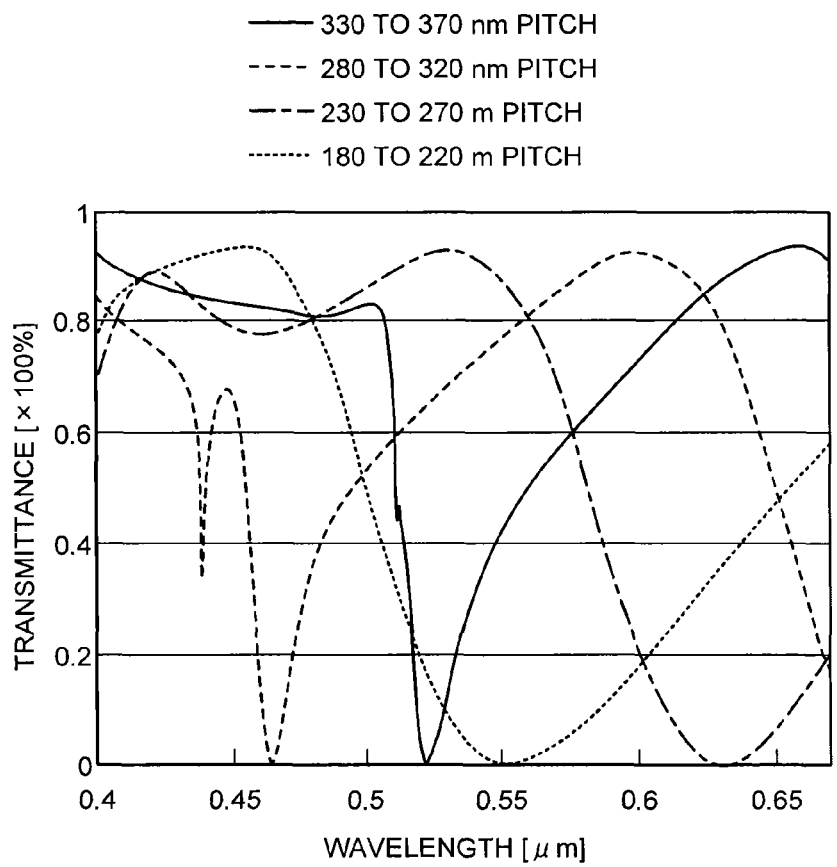
FIG. 4 is a diagram illustrating forms of transmittance of light in a case where a pitch of a hole of a diffraction grating portion is changed.

FIG. 4 is a diagram illustrating forms of transmittance of light in a case where a pitch of a hole of a diffraction grating portion is changed. In this figure, the horizontal axis indicates a wavelength of the light incident on the diffraction grating portions 20L, 20M, and 20S; and the vertical axis indicates transmittance of the light incident on the diffraction grating portions 20L, 20M, and 20S. For example, if the columnar holes are formed at a pitch of from 180 nm to 220 nm, the transmittance of the light near 0.63 µm becomes 0%, so that the red light can be reflected. In addition, if the columnar holes are formed at a pitch of from 230 nm to 270 nm, the transmittance of the light near 0.55 µm becomes 0%; and if the columnar holes are formed at a pitch of from 280 nm to 320 nm, the transmittance of the light near 0.53 µm becomes 0%, so that the green light can be reflected. Similarly, if the columnar holes are formed at a pitch of from 330 nm to 370 nm, the transmittance of the light near 0.46 µm becomes 0%, so that the blue light can be reflected. In addition, herein, measurement is performed by using the diffraction grating portions 20L, 20M, and 20S where the columnar holes of which the diameter is ½ of the pitch are two-dimensionally arrayed at the pitch described above. In this manner, the wavelength of the light which can be reflected by the diffraction grating portions 20L, 20M, and 20S of the pixel areas $R_L$, $R_M$, and $R_S$ can be changed by changing the pitch of the columnar holes (diameter and pitch of the holes). In addition, this is an example. For example, in the case where the columnar holes are two-dimensionally arrayed so that the diameter of the columnar hole is not ½ of the pitch thereof, the relationship between the wavelength of the reflected light and the diameter or pitch of the columnar hole is different.

Figure 5:
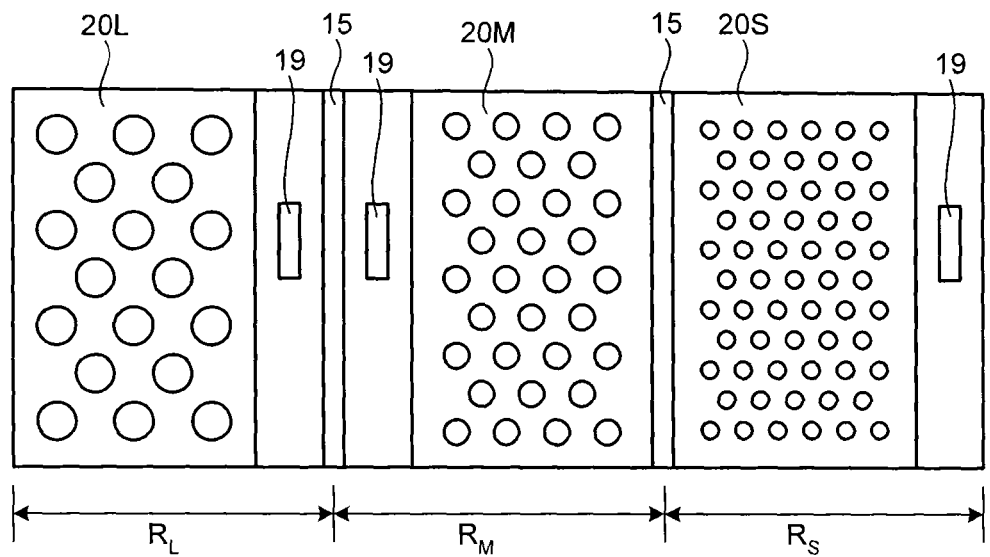
FIG. 5 is a schematic plane diagram illustrating a shape of a guided-mode resonance grating.

FIG. 5 is a schematic plane diagram illustrating a shape of a guided-mode resonance grating. In this figure, the columnar holes are arrayed in a predetermined rule (for example, in a triangular lattice shape) in each of the pixel areas $R_L$, $R_M$, and $R_S$. In this figure, in the first pixel area $R_L$ corresponding to the longest wavelength, the pitch (diameter) of the holes formed in the diffraction grating portion 20L is longest; in the third pixel area $R_S$ corresponding to the shortest wavelength, the pitch (diameter) of the holes formed in the diffraction grating portion 20S is shortest; and in the second pixel area $R_M$ corresponding to the middle wavelength, the pitch (diameter) of the holes formed in the diffraction grating portion 20M is in the middle between those of the diffraction grating portions 20L and 20S. Therefore, the light incident on the pixels $P_L$, $P_M$, and $P_S$ are reflected through the microlens 52 and the color filters 51 on the rear surface of the solid state imaging device. In this manner, in the second embodiment, with respect to all the pixel areas $R_L$, $R_M$, and $R_S$, the diffraction grating portions 20L, 20M, and 20S are disposed so as to reflect the light incident on the pixel areas $R_L$, $R_M$, and $R_S$. Therefore, the optical lengths of the second and third light having wavelength shorter than that of the first light are also increased, so that the light can be efficiently absorbed by the photodiodes PD.

In addition, the same components as those of the first embodiment are denoted by the same reference numerals, and the description thereof is omitted. In addition, a method of manufacturing the solid state imaging device having the aforementioned structure is basically the same as the method of manufacturing the solid state imaging device described in the first embodiment except that the columnar penetrating holes having different pitches and diameters are two-dimensionally periodically arrayed in the pixel areas $R_L$, $R_M$, and $R_S$ when the columnar penetrating holes 201 of the diffraction grating portion 20L are patterned in FIG. 2F in the first embodiment, and thus, the description thereof is omitted.

In the second embodiment, since the diffraction grating portions 20M and 20S which reflect the respective second and third light are formed through the protective film 12 on the photodiodes PD of the second and third pixel areas $R_M$ and $R_S$ which detect the second and third light having wavelength longer than that of the first light, it is possible to increase the optical lengths of the second and third light, which are incident on the second and third pixel areas $R_M$ and $R_S$, in the photodiodes PD. As a result, in addition to the effect of the first embodiment, it is possible to obtain an effect in that it is possible to prevent light receiving sensitivity of the second and third light from deteriorating.

Third Embodiment

Figure 6:
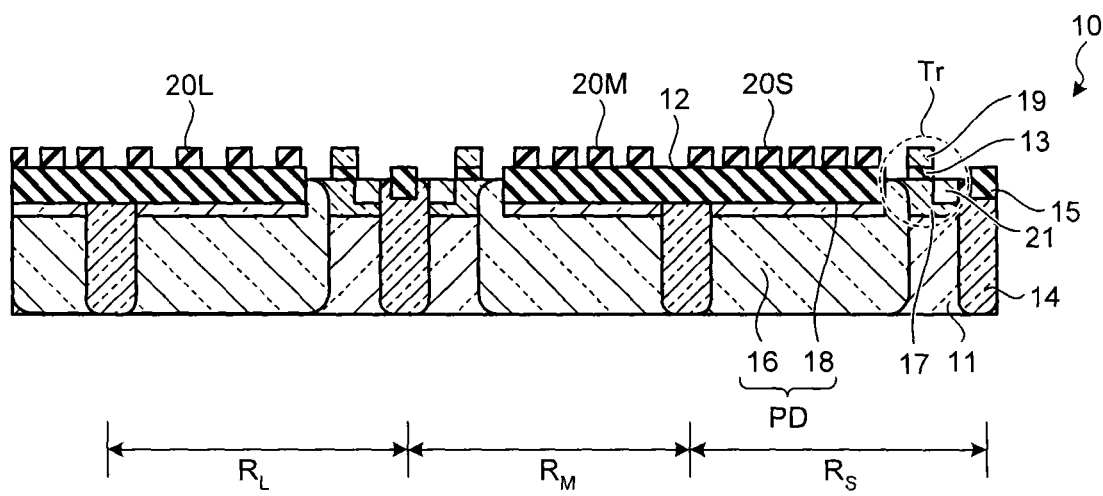
FIG. 6 is a schematic cross-sectional diagram illustrating a configuration of a pixel formation portion of a solid state imaging device according to a third embodiment.

FIG. 6 is a schematic cross-sectional diagram illustrating a configuration of a pixel formation portion of a solid state imaging device according to a third embodiment. In the second embodiment, the thickness of the protective film 12 formed on the photodiode PD is in a range from 2 nm to 10 nm. However, in the third embodiment, the thickness of the protective film 12 is configured to be in a range from 10 nm to 400 nm. For example, a silicon oxide film having a thickness of from 10 nm to 400 nm may be used as the protective film 12. In this manner, since the thickness of the protective film 12 is configured to be in a range from 10 nm to 400 nm, a large resonance effect occurs in comparison with the second embodiment, so that light can be easily reflected by the diffraction grating portions 20L, 20M, and 20S in comparison with a case where the protective film 12 is thin. In the case where the thickness of the protective film 12 is less than 10 nm, the resonance effect does not occur, and the incident light cannot be sufficiently reflected. In addition, in a case where the thickness of the protective film 12 is more than 400 nm, since the light reflection effect is rarely changed when the thickness is increased beyond this, it is preferable that the thickness of the protective film 12 is configured to be in the aforementioned range. In addition, similarly to the second embodiment, the diameter and pitch of the columnar penetrating holes are adjusted so that the diffraction grating portions 20L, 20M, and 20S can reflect the light incident on the pixel areas $R_L$, $R_M$, and $R_S$. In addition, the same components as those of the first and second embodiments are denoted by the same reference numerals, and the description thereof is omitted.

Now, a method of manufacturing the solid state imaging device having the aforementioned structure will be described. FIGS. 7A to 7F are schematic cross-sectional diagrams illustrating an example of a procedure of a method of manufacturing the solid state imaging device according to the third embodiment.

Figure 7A:
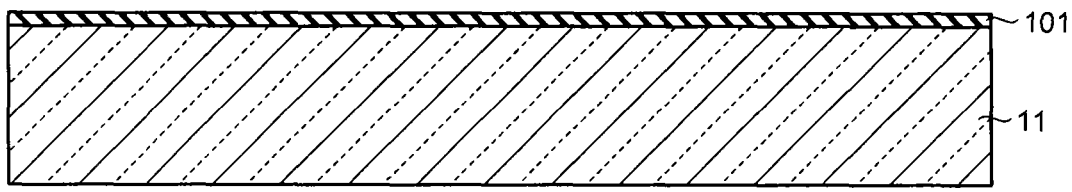
FIGS. 7A to 7F are schematic cross-sectional diagrams illustrating an example of a procedure of a method of manufacturing the solid state imaging device according to the third embodiment.
Figure 7B:
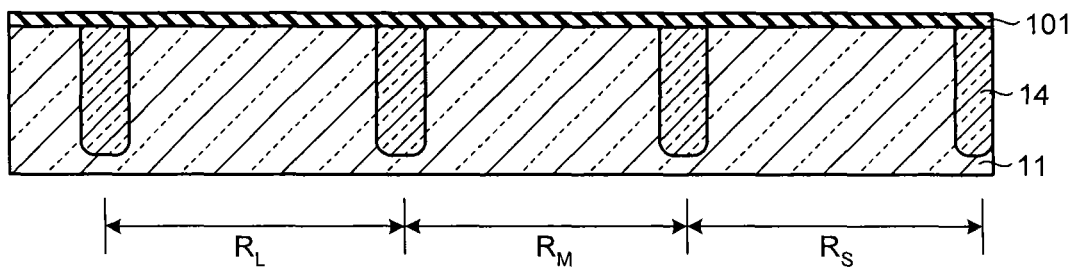

First, as illustrated in FIG. 7A, the P-type single crystal silicon substrate 11 (hereinafter, simply referred to as a substrate) is prepared, and a pad oxide film 101 is formed on the one main surface of the substrate 11 by using thermal oxidation. Next, as illustrated in FIG. 7B, the pixel isolation portion 14 which is made of a P-type diffusion layer is formed by implanting P-type impurities such as B according to an ion implantation method in a boundary of each of the pixel areas $R_L$, $R_M$, and $R_S$. Therefore, the first pixel area $R_L$ which detects the first light, the second pixel area $R_M$ which detects the second light, and the third pixel area $R_S$ which detects the third light are formed on the substrate 11.

Figure 7C:
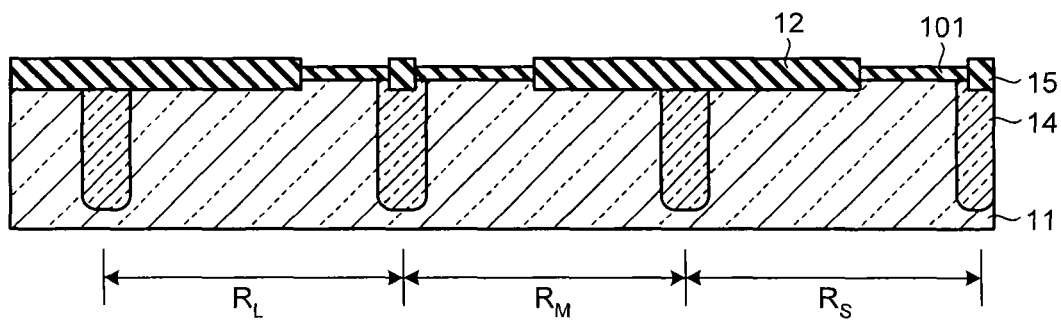

Next, a not-illustrated silicon nitride film is formed on the pad oxide film 101, and after the silicon nitride film is processed by using a lithography technique and an etching technique so that an area where the read transistor Tr is to be formed is covered with the silicon nitride film, thermal oxidation is performed and the silicon nitride film is removed. Therefore, as illustrated in FIG. 7C, the protective film 12 having a thickness of from 10 nm to 400 nm and the element isolation insulating film 15 are formed in an area excluding the area for formation of the read transistor Tr. The protective film 12 is formed in the area where the photodiode PD is to be formed, and the element isolation insulating film 15 is formed on the pixel isolation portion 14. In this manner, in the third embodiment, the protective film 12 and the element isolation insulating film 15 are produced in the same process.

Figure 7D:
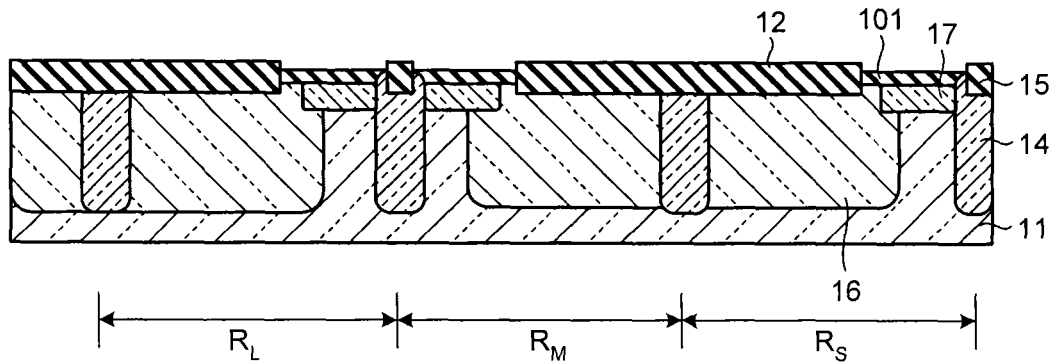
Figure 7E:
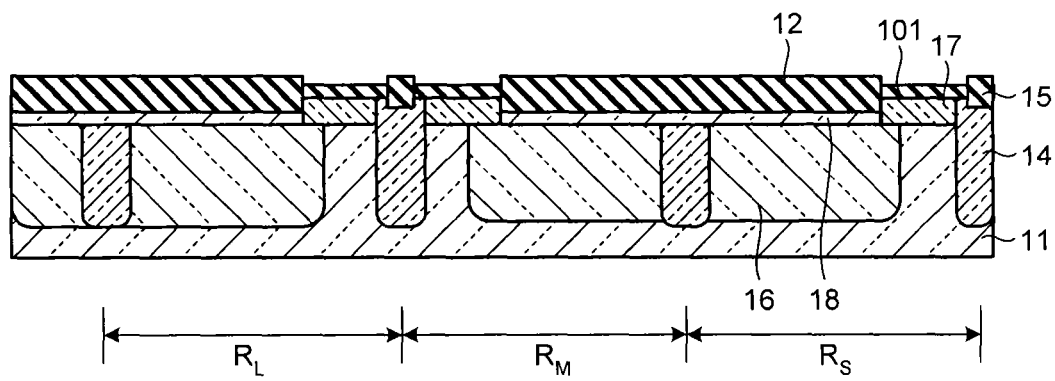

Next, as illustrated in FIG. 7D, the N-type diffusion layer 16 is formed by implanting N-type impurities such as P in an area where the photodiode PD in each of the pixel areas $R_L$, $R_M$, and $R_S$ is to be formed, and the P-type well 17 which is made of a P-type diffusion layer is formed by implanting P-type impurities such as B in an area where the read transistor Tr is to be formed. In addition, the bottom of the N-type diffusion layer 16 is formed so as to be the same as the bottom of the P-type diffusion layer constituting the pixel isolation portion 14, and the P-type well 17 is formed in an area which is shallower than the N-type diffusion layer 16. Next, as illustrated in FIG. 7E, the charge storage layer 18 which is made of a P-type diffusion layer is formed by implanting P-type impurities such as B in the shallow area of the upper portion of the N-type diffusion layer 16.

Figure 7F:
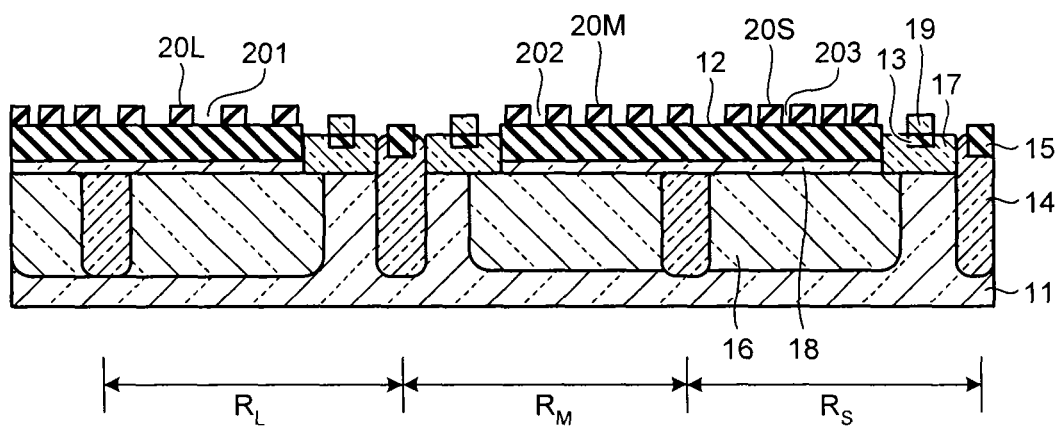

Next, as illustrated in FIG. 7F, for example, a not-illustrated silicon nitride film is formed on the substrate 11, and after the silicon nitride film is processed by using a lithography technique and an etching technique so that an area where the P-type well 17 is to be formed is opened, the pad oxide film 101 on the P-type well 17 is removed by using, for example, hydrofluoric acid. Next, a gate insulating film 13 is formed on the P-type well 17 by using a method such as thermal oxidation. In addition, for example, a polycrystal silicon film is formed on the substrate 11 where the gate insulating film 13 is formed, and the polycrystal silicon film and the gate insulating film 13 are patterned in a predetermined shape by using a lithography technique and an etching technique. Therefore, a stacked structure of the gate insulating film 13 and the gate electrode 19 is formed.

Next, after a silicon nitride film (not illustrated) is removed by using hot phosphoric acid or the like, a diffraction grating constituent material is formed. A polycrystal silicon film, a $TiO_2$ film, a $Ta_2O_5$ film or the like may be used as the diffraction grating constituent material. Next, by using a lithography technique and an etching technique such as an RIE method, the columnar penetrating holes 201 which reflects the first light is formed in a predetermined period in the diffraction grating constituent material of the first pixel area $R_L$, so that the diffraction grating portion 20L is formed; the columnar penetrating holes 202 which reflects the second light is formed in a predetermined period in the diffraction grating constituent material of the second pixel area $R_M$, so that the diffraction grating portion 20M is formed; and the columnar penetrating holes 203 which reflects the third light is formed in a predetermined period in the diffraction grating constituent material of the third pixel area $R_S$, so that the diffraction grating portion 20S is formed. At this time, when the diffraction grating portions 20L, 20M, and 20S are formed by using an etching technique, since the diffraction grating constituent materials are formed through the protective film 12 on the photodiodes PD, the photodiodes PD are not damaged by etching.

Next, the source/drain area 21 of the read transistor Tr which is made of an N-type diffusion layer is formed by implanting N-type impurities such as P according to an ion implantation method in an area interposed between the gate electrode 19 and the pixel isolation portion 14, so that the pixel formation portion 10 of the solid state imaging device illustrated in FIG. 6 is obtained.

Next, as described in FIG. 2H and the following figures of the first embodiment, after a not-illustrated peripheral circuit is formed, the multi-layered wiring layer 31 is formed on the substrate 11 where the diffraction grating portions 20L, 20M, and 20S and the read transistor Tr are formed. Next, after the uppermost-layer interlayer insulating film 32 of the multi-layered wiring layer 31 is planarized, the supporting substrate 41 such as a silicon substrate is adhered through an adhesive layer, and grinding is performed on the rear surface side of the substrate 11 until the N-type diffusion layer 16 is exposed. Next, the color filters 51L, 51M, and 51S transmitting only the respective light having predetermined wavelength are formed on the pixel areas $R_L$, $R_M$, and $R_S$, and the microlenses 52 are further formed thereon, so that the solid state imaging device can be obtained.

According to the third embodiment, since the thickness of the protective film 12 is configured to be in a range from 10 nm to 400 nm, in addition to the effect of the second embodiment, it is possible to obtain an effect in that it is possible to more effectively reflect the light incident on the pixel areas $R_L$, $R_M$, and $R_S$. In addition, since the protective film 12 and the element isolation insulating film 15 can be formed simultaneously, it is possible to obtain an effect in that it is possible to simply the processes of manufacturing the solid state imaging device.

Fourth Embodiment

Figure 8:
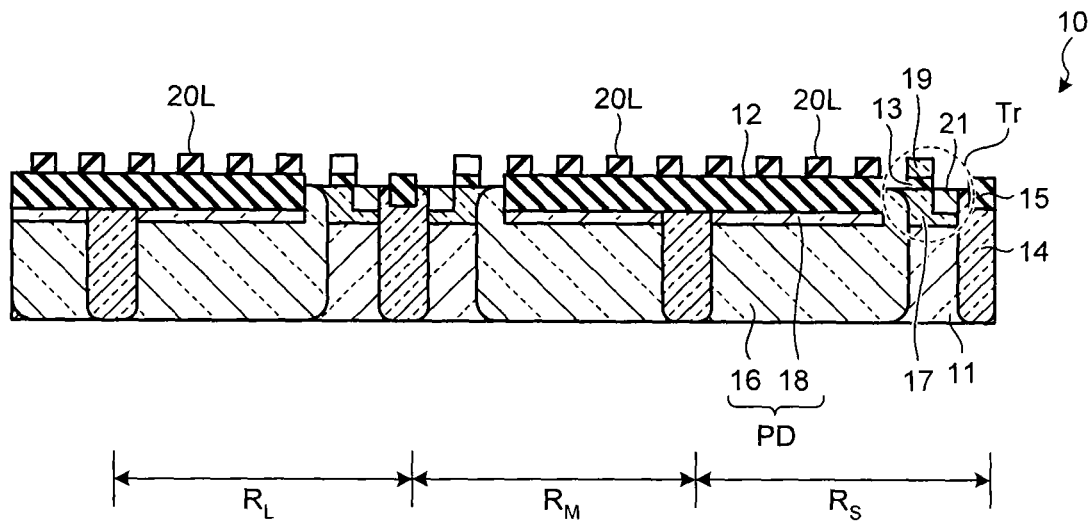
FIG. 8 is a schematic cross-sectional diagram illustrating a configuration of a pixel formation portion of a solid state imaging device according to a fourth embodiment.

FIG. 8 is a schematic cross-sectional diagram illustrating a configuration of a pixel formation portion of a solid state imaging device according to a fourth embodiment. In the third embodiment, in the diffraction grating portions 20L, 20M, and 20S formed on the protective film 12 having a thickness of from 10 nm to 400 nm, the diameter and pitch of the columnar holes are configured to be changed so as to reflect light incident on the pixel areas $R_L$, $R_M$, and $R_S$. However, similarly to the first embodiment, it is preferable that the diffraction grating portion is formed at least on the first pixel area $R_L$ which detects the first light having the long wavelength which is difficult to be absorbed in the photodiode PD. Therefore, in the fourth embodiment, the diffraction grating portion 20L, where the columnar holes having diameter and thickness which are adjusted so as to reflect the first light are two-dimensionally arrayed, is formed on the protective film 12 having a thickness of from 10 nm to 400 nm in the first, second, and third pixel areas $R_L$, $R_M$, and $R_S$. In this manner, since the thickness of the protective film 12 is configured to be in a range from 10 nm to 400 nm, a large resonance effect occurs in comparison with the first embodiment, so that light can be easily reflected by the diffraction grating portion 20L in comparison with a case where the protective film 12 is thin. In addition, the same components as those of the first to third embodiments are denoted by the same reference numerals, and the description thereof is omitted. In addition, a method of manufacturing the solid state imaging device having the aforementioned structure is the same as the method described in the third embodiment, and thus, the description thereof is omitted.

According to the fourth embodiment, since the thickness of the protective film 12 is configured to be in a range from 10 nm to 400 nm, in addition to the effect of the first embodiment, it is possible to obtain an effect in that it is possible to more effectively reflect the light incident on the pixel areas $R_L$, $R_M$, and $R_S$. In addition, since the protective film 12 and the element isolation insulating film 15 can be formed simultaneously, it is possible to obtain an effect in that it is possible to simplify the processes of manufacturing the solid state imaging device.

Fifth Embodiment

Figure 9:
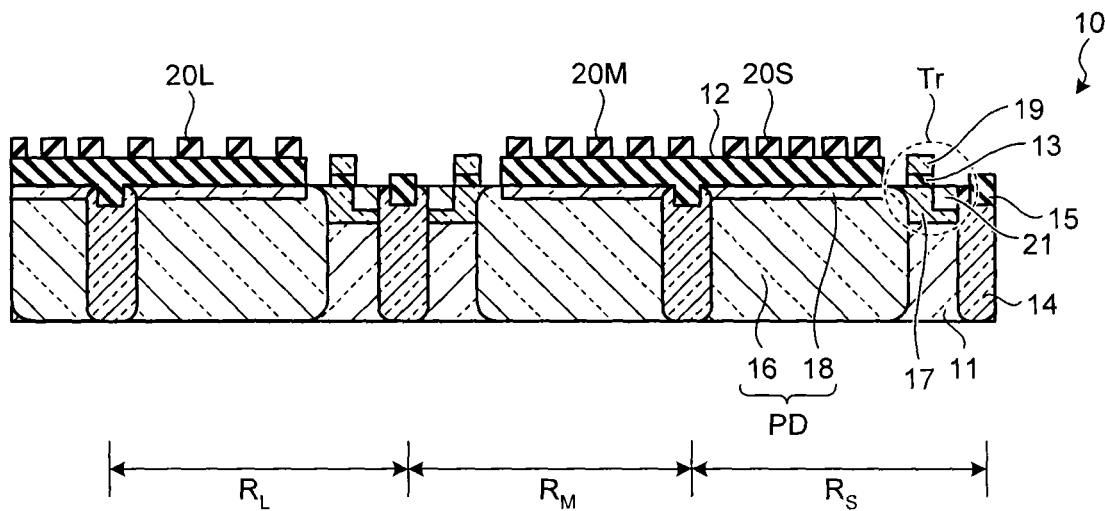
FIG. 9 is a schematic cross-sectional diagram illustrating a configuration of a pixel formation portion of a solid state imaging device according to a fifth embodiment.

FIG. 9 is a schematic cross-sectional diagram illustrating a configuration of a pixel formation portion of a solid state imaging device according to a fifth embodiment. In the third embodiment, since the protective film 12 and the element isolation insulating film 15 are formed in the same process, the protective film 12 and the element isolation insulating film 15 are substantially equal to each other in terms of the surface height and thickness. However, in the fifth embodiment, the protective film 12 and the element isolation insulating film 15 are different from each other in terms of formation position in the height direction. In addition, the same components as those of the first to third embodiments are denoted by the same reference numerals, and the description thereof is omitted.

Now, a method of manufacturing the solid state imaging device having the aforementioned structure will be described. FIGS. 10A to 10H are schematic cross-sectional diagrams illustrating an example of a procedure of a method of manufacturing the solid state imaging device according to the fifth embodiment.

Figure 10A:
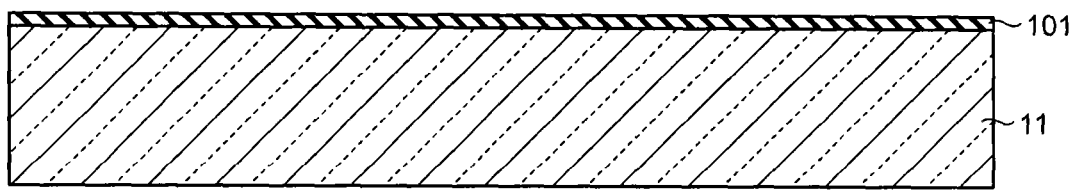
FIGS. 10A to 10H are schematic cross-sectional diagrams illustrating an example of a procedure of a method of manufacturing the solid state imaging device according to the fifth embodiment.
Figure 10B:
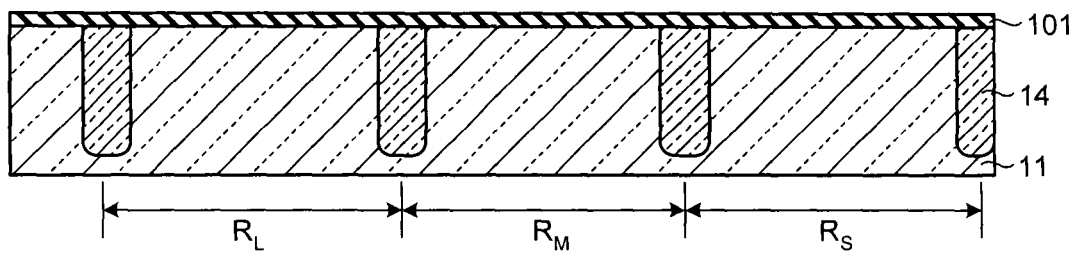

First, as illustrated in FIG. 10A, the P-type single crystal silicon substrate 11 (hereinafter, simply referred to as a substrate) is prepared, and a pad oxide film 101 is formed on the one main surface of the substrate 11 by using thermal oxidation. Next, as illustrated in FIG. 10B, the pixel isolation portion 14 which is made of a P-type diffusion layer is formed by implanting P-type impurities such as B according to an ion implantation method in a boundary of each of the pixel areas $R_L$, $R_M$, and $R_S$. Therefore, the first pixel area $R_L$ which detects the first light, the second pixel area $R_M$ which detects the second light, and the third pixel area $R_S$ which detects the third light are formed on the substrate 11.

Figure 10C:
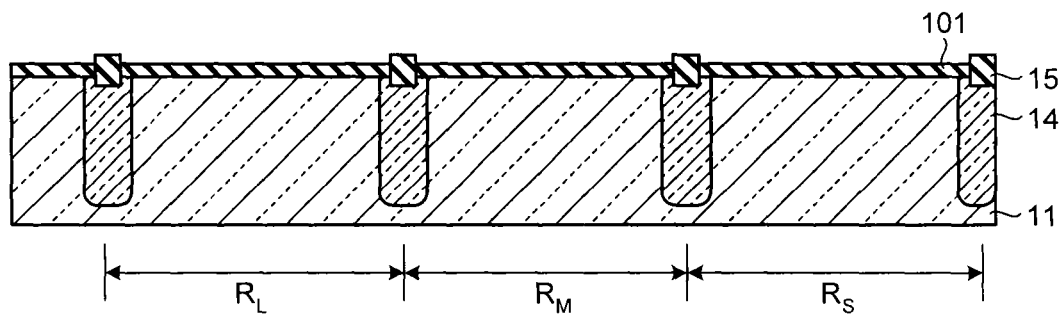

Next, a not-illustrated silicon nitride film is formed on the pad oxide film 101, and after the silicon nitride film is processed by using a lithography technique and an etching technique so that an area where the element isolation insulating film 15 is to be formed is opened, thermal oxidation is performed and the silicon nitride film is removed. Therefore, as illustrated in FIG. 10C, the element isolation insulating film 15 which is thicker than the pad oxide film 101 is formed on the pixel isolation portion 14.

Figure 10D:
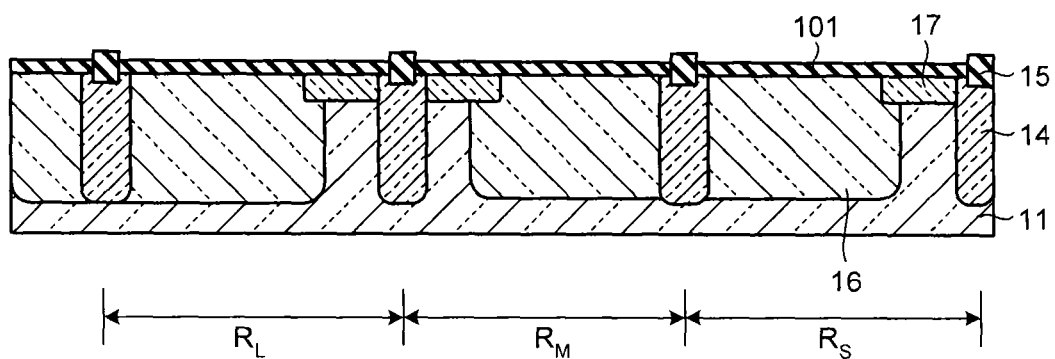
Figure 10E:
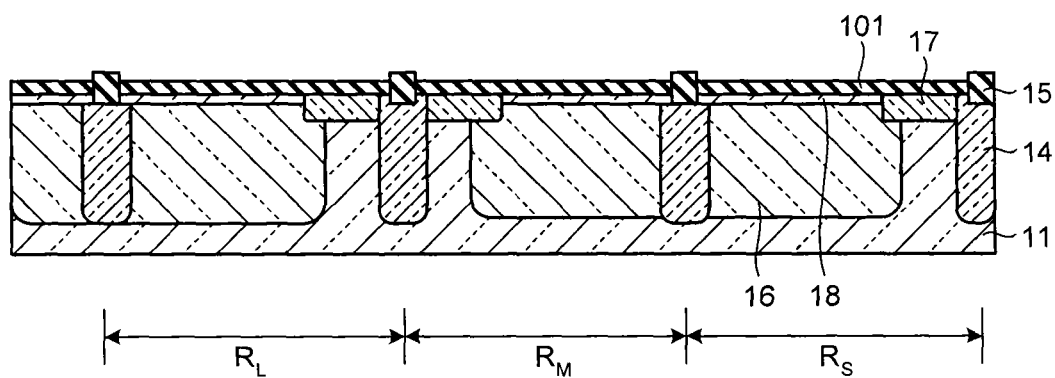

Next, as illustrated in FIG. 10D, the N-type diffusion layer 16 is formed by implanting N-type impurities such as P in an area where the photodiode PD in each of the pixel areas $R_L$, $R_M$, and $R_S$ is to be formed, and the P-type well 17 which is made of a P-type diffusion layer is formed by implanting P-type impurities such as B in an area where the read transistor Tr is to be formed. In addition, the bottom of the N-type diffusion layer 16 is formed so as to be the same as the bottom of the P-type diffusion layer constituting the pixel isolation portion 14, and the P-type well 17 is formed in an area which is shallower than the N-type diffusion layer 16. Next, as illustrated in FIG. 10E, the charge storage layer 18 which is made of a P-type diffusion layer is formed by implanting P-type impurities such as B in the shallow area of the upper portion of the N-type diffusion layer 16.

Figure 10F:
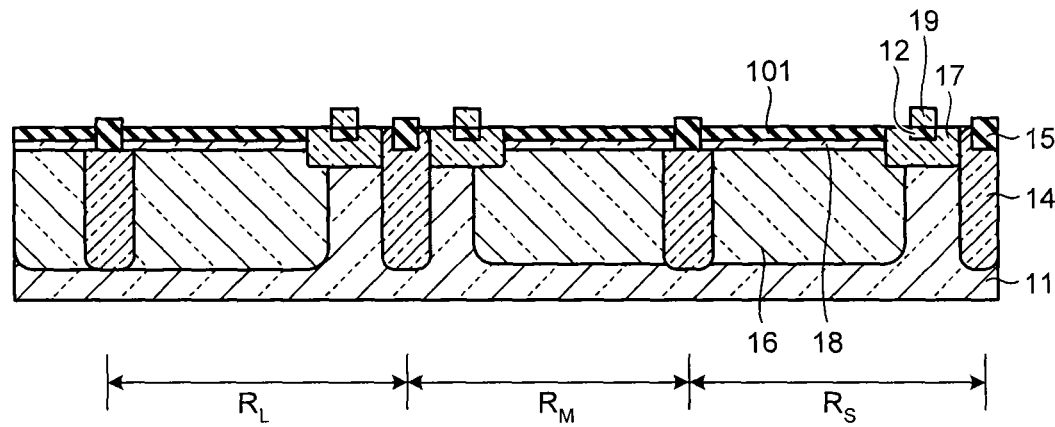

Next, as illustrated in FIG. 10F, for example, a not-illustrated silicon nitride film is formed on the substrate 11, and after the silicon nitride film is processed by using a lithography technique and an etching technique so that an area where the P-type well 17 is to be formed is opened, the pad oxide film 101 on the P-type well 17 is removed by using, for example, hydrofluoric acid. Next, a gate insulating film 13 is formed on the P-type well 17 by using a method such as thermal oxidation. In addition, for example, a polycrystal silicon film is formed on the substrate 11 where the gate insulating film 13 is formed, and the polycrystal silicon film and the gate insulating film 13 are patterned in a predetermined shape by using a lithography technique and an etching technique. Therefore, a stacked structure of the gate insulating film 13 and the gate electrode 19 is formed.

Figure 10G:
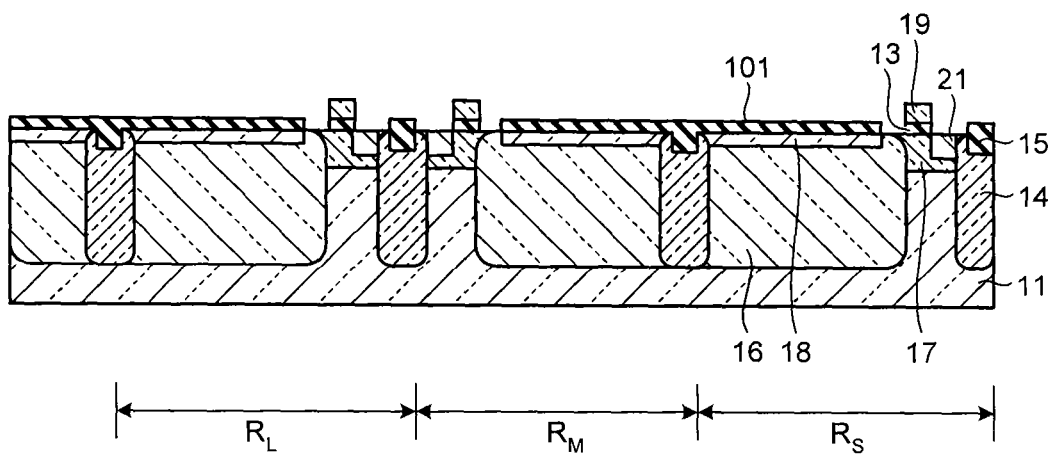

Next, after a not-illustrated silicon nitride film is removed by using hot phosphoric acid or the like, as illustrated in FIG. 10G, the source/drain area 21 of the read transistor Tr which is made of an N-type diffusion layer is formed by implanting N-type impurities such as P according to an ion implantation method in an area interposed between the gate electrode 19 and the pixel isolation portion 14.

Figure 10H:
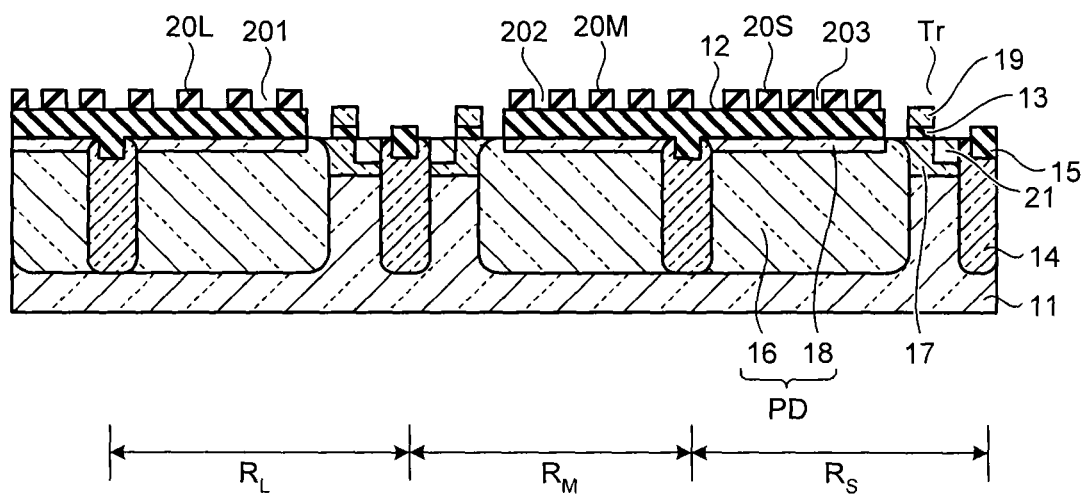

Next, as illustrated in FIG. 10H, the protective film 12 is formed on the photodiodes PD (on the formation areas of the diffraction grating portions 20L, 20M, and 20S). For example, after resist is formed by using a lithography technique so that the formation area of the photodiode PD is opened, the protective film 12 such as a silicon oxide film is formed by using a film formation method such as a CVD method, and after that, the resist is removed. In addition, the formed protective film 12 and the pad oxide film 101 collectively constitute the protective film 12. In addition, the thickness of the protective film 12 may be in a range from 10 nm to 400 nm.

Next, a diffraction grating constituent material is formed on the protective film 12. A polycrystal silicon film, a $TiO_2$ film, a $Ta_2O_5$ film or the like may be used as the diffraction grating constituent material. Next, by using a lithography technique and an etching technique such as an RIE method, the columnar penetrating holes 201 which reflect the first light are formed in a predetermined period in the diffraction grating constituent material of the first pixel area $R_L$, so that the diffraction grating portion 20L is formed; the columnar penetrating holes 202 which reflect the second light are formed in a predetermined period in the diffraction grating constituent material of the second pixel area $R_M$, so that the diffraction grating portion 20M is formed; and the columnar penetrating holes 203 which reflect the third light are formed in a predetermined period in the diffraction grating constituent material of the third pixel area $R_S$, so that the diffraction grating portion 20S is formed. At this time, when the diffraction grating portions 20L, 20M, and 20S are formed by using an etching technique, since the diffraction grating constituent materials are formed through the protective film 12 on the photodiodes PD, the photodiodes PD are not damaged by etching. Accordingly, the pixel formation portion 10 of the solid state imaging device illustrated in FIG. 9 is obtained.

Next, as described in FIG. 2H and the following figures of the first embodiment, after a not-illustrated peripheral circuit is formed, the multi-layered wiring layer 31 is formed on the substrate 11 where the diffraction grating portions 20L, 20M, and 20S and the read transistor Tr are formed. Next, after the uppermost-layer interlayer insulating film 32 of the multi-layered wiring layer 31 is planarized, the supporting substrate 41 such as a silicon substrate is adhered through an adhesive layer, and grinding is performed on the rear surface side of the substrate 11 until the N-type diffusion layer 16 is exposed. Next, the color filters 51L, 51M, and 51S transmitting only the respective light having predetermined wavelength are formed on the pixel areas $R_L$, $R_M$, and $R_S$, and the microlenses 52 are further formed thereon, so that the solid state imaging device can be obtained.

According to the fifth embodiment, since the thickness of the protective film 12 is configured to be in a range from 10 nm to 400 nm, in addition to the effect of the second embodiment, it is possible to obtain an effect in that it is possible to more effectively reflect the light incident on the pixel areas.

Sixth Embodiment

Figure 11:
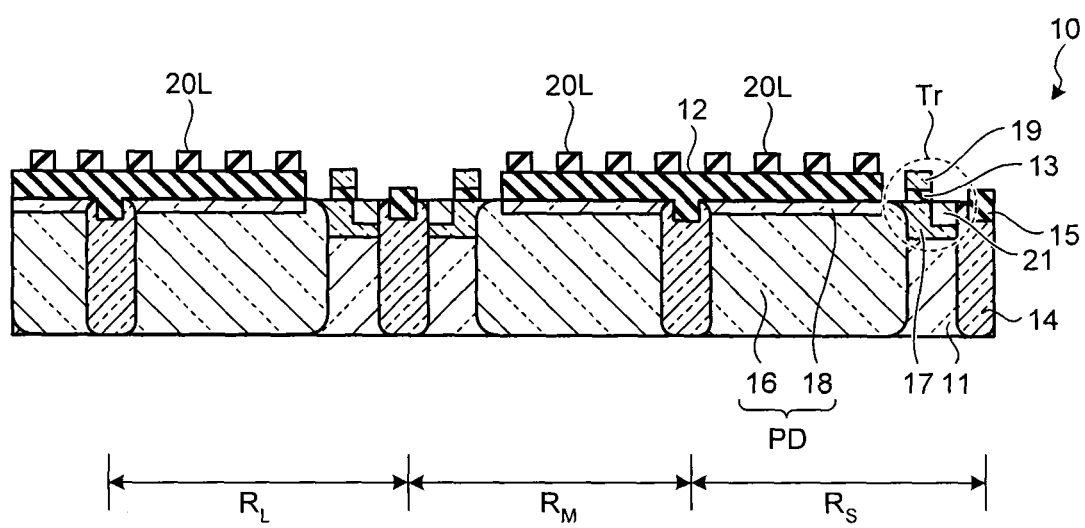
FIG. 11 is a schematic cross-sectional diagram illustrating a configuration of a pixel formation portion of a solid state imaging device according to a sixth embodiment.

FIG. 11 is a schematic cross-sectional diagram illustrating a configuration of a pixel formation portion of a solid state imaging device according to a sixth embodiment. In the fifth embodiment, in the diffraction grating portions 20L, 20M, and 20S formed on the protective film 12 having a thickness of from 10 nm to 400 nm, the diameter and pitch of the columnar holes are configured to be changed so as to reflect light incident on the pixel areas $R_L$, $R_M$, and $R_S$. However, similarly to the first embodiment, it is preferable that the diffraction grating portion is formed at least on the first pixel area $R_L$ which detects the first light having the long wavelength which is difficult to be absorbed in the photodiode PD. Therefore, in the sixth embodiment, the diffraction grating portion 20L, where the columnar holes having diameter and thickness which are adjusted so as to reflect the first light are two-dimensionally arrayed, is formed on the protective film 12 having a thickness of from 10 nm to 400 nm in the first, second, and third pixel areas $R_L$, $R_M$, and $R_S$. In this manner, since the thickness of the protective film 12 is configured to be in a range from 10 nm to 400 nm, a large resonance effect occurs in comparison with the first embodiment, so that light can be easily reflected by the diffraction grating portion 20L in comparison with a case where the protective film 12 is thin. In addition, the same components as those of the first to fifth embodiments are denoted by the same reference numerals, and the description thereof is omitted. In addition, a method of manufacturing the solid state imaging device having the aforementioned structure is the same as the method described in the fifth embodiment, and thus, the description thereof is omitted.

According to the sixth embodiment, since the thickness of the protective film 12 is configured to be in a range from 10 nm to 400 nm, in addition to the effect of the first embodiment, it is possible to obtain an effect in that it is possible to more effectively reflect the light incident on the pixel areas.

In addition, in the embodiments described above, one picture element is configured to include three pixels $P_L$, $P_M$, and $P_S$. However, in a case where one picture element is configured to include two or more pixels, the aforementioned embodiments can be applied in the same manner. In addition, in the above description, a rear surface illumination type solid state imaging device is exemplified. However, with respect to a front surface illumination type solid state imaging device, where diffraction grating portions are disposed through a protective film 12 such as a silicon oxide film on formation areas of photodiodes PD at the rear surface of a substrate 11 at the side facing the light incident surface side thereof, the aforementioned embodiments can be applied in the same manner.

In addition, in the above description, a case where a P-type single crystal silicon substrate is used as a substrate is exemplified. An N-type single crystal silicon substrate may be used. In this case, except that the conductivity type of the substrate is changed to the N type, conductivity types of the components are the same as those described above. In addition, in the above description, although a single crystal silicon substrate is used as the substrate, a single crystal semiconductor substrate such as a single crystal germanium substrate or a single crystal gallium arsenide substrate may be used, or a polycrystal semiconductor substrate such as a polycrystal silicon substrate or a polycrystal germanium substrate may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state imaging device where picture elements are two-dimensionally arrayed in a predetermined period on a semiconductor substrate, each of picture elements having a plurality of pixels to detect light having different wavelengths, each of the plurality of pixels including a filter which transmits light having a predetermined wavelength and a photodiode which detects the light having a predetermined wavelength transmitting through the filter,
    wherein a pixel, of the plurality of pixels, which detects light having a longest wavelength in each of the picture elements includes:
        a protective film which is disposed on the photodiode on a side of a main surface of the semiconductor substrate; and
        a first diffraction grating portion which is disposed on the protective film on the side of the main surface and where a first set of columnar holes penetrating in a thickness direction are two-dimensionally arrayed,
    wherein a diameter and array period of the columnar holes of set are such that the first diffraction grating portion reflects the light transmitting through the filter disposed in the pixel which detects light having the longest wavelength in the picture element, and
    the main surface of the semiconductor substrate is on an opposite side to a light incident surface.

2. The solid state imaging device according to claim 1, wherein, of the plurality of pixels, a different pixel than the pixel which detects the light having the longest wavelength in the picture element includes:
    the protective film which is disposed on the photodiode on the side of the main surface of the semiconductor substrate; and
    a second diffraction grating portion which is disposed on the protective film on the side of the main surface and where a second set of columnar holes penetrating in the thickness direction are two-dimensionally arrayed.

3. The solid state imaging device according to claim 2, wherein a diameter and array period of the second set of columnar holes in the second diffraction grating portion are the same as those of the first set of columnar holes in the first diffraction grating portion.

4. The solid state imaging device according to claim 2, wherein the diameter and array period of the second set of columnar holes are such that the second diffraction grating portion reflects the light transmitting through the filter disposed in the different pixel.

5. The solid state imaging device according to claim 1, wherein the first diffraction grating portion is made of a material having a refractive index higher than that of the protective film.

6. The solid state imaging device according to claim 5, wherein the protective film is comprised of a silicon oxide film, and the first diffraction grating portion is made of any one of silicon, $TiO_2$, and $Ta_2O_5$.

7. The solid state imaging device according to claim 2, wherein the second diffraction grating portion is made of a material having a refractive index higher than that of the protective film.

8. The solid state imaging device according to claim 7, wherein the protective film is comprised of a silicon oxide film, and the second diffraction grating portion is made of any one of silicon, $TiO_2$, and $Ta_2O_5$.

9. The solid state imaging device according to claim 1, wherein each of the pixels further includes a read transistor which reads charges which are acquired through photoelectric conversion by the photodiode, and
    a thickness of the protective film s substantially equal to that of a gate insulating film of the read transistor, and a height of the protective film is substantially equal to that of a surface of the gate insulating film.

10. The solid state imaging device according to claim 1, further comprising an element isolation insulating film which is disposed at a boundary between adjacent pixels of the plurality near a surface of the semiconductor substrate,
    wherein a thickness of the protective film is substantially equal to that of the element isolation insulating film, and a height of the protective film is substantially equal to that of a surface of the element isolation insulating film.

11. The solid state imaging device according to claim 1, wherein each of the picture elements includes three pixels which detect red light, green light, and blue light, respectively.

12. The solid state imaging device according to claim 1, further comprising a multi-layered wiring layer disposed on a formation surface side of a PN junction surface of the photodiode in the semiconductor substrate,
wherein the filter are disposed on a surface of a side facing a formation surface of the multi-layered wiring layer of the semiconductor substrate.

13. The solid state imaging device according to claim 1, wherein each of the picture elements includes three pixels which detect yellow light, magenta light, and cyan light, respectively.

14. The solid state imaging device according to claim 1, wherein a thickness of the protective film is in a range from 2 nm to 400 nm.

15. A method of manufacturing a solid state imaging device, comprising:
forming a first insulating film on a first main surface of a first conductivity type semiconductor substrate;
forming, in the semiconductor substrate, a pixel isolation portion that partitions the semiconductor substrate into pixel areas, each of the areas being an area in which a pixel is capable of being formed, a predetermined number of the pixel areas constituting a picture element formation area;
forming an element isolation insulating film in an upper portion of the semiconductor substrate at a formation position of the pixel isolation portion;
forming a second conductivity type first diffusion layer on the pixel areas;
forming a charge storage layer by forming a first conductivity type second diffusion layer a shallow area of the first diffusion layer;
forming a first diffraction grating on the first insulating film of a first pixel area of the pixel areas in the picture element formation area;
grinding a second main surface of the semiconductor substrate so that the semiconductor substrate has a predetermined thickness, the second main surface being on an opposite side to the first main surface; and
forming filters, which transmit to be detected in the pixel areas, on the pixel areas of the second main surface,
wherein, in said forming of the first diffraction grating, a first set of columnar holes penetrating in a thickness direction are two-dimensionally arrayed so that the first diffraction grating reflects the light transmitting through a corresponding filter of the formed filters disposed in the first pixel area, the first diffraction grating being disposed on a side of the first main surface of the semiconductor substrate on an opposite side to the second main surface on which the filters are formed.

16. The method according to claim 15, wherein, in said forming of the first diffraction grating, the first diffraction gratings are also formed in a second pixel area different from the first pixel area in the picture element formation area.

17. The method according to claim 15, wherein, in said forming of the first diffraction grating, second diffraction gratings are formed in a second pixel area different from the first pixel area in the picture element formation area, and
a second set of columnar holes penetrating in the thickness direction are two-dimensionally arrayed in the second diffraction gratings so that the second diffraction gratings reflect light transmitting through the filter disposed in the second pixel area.

18. The method according to claim 15,
wherein, in said forming of the element isolation insulating film, the element isolation insulating film is formed in a predetermined area in the pixel area other than the formation position of the pixel isolation portion, and
the first diffraction grating is formed on the element isolation insulating film in the pixel area.

19. The method according to claim 15,
wherein, after said forming of the charge storage layer, before said forming of the first diffraction grating, a second insulating film is formed on the first insulating film of a predetermined area in the pixel area, and
in said forming of the first diffraction grating, the first diffraction grating is formed on the second insulating film.

20. The method according to claim 15, wherein, after said forming of the first diffraction grating, before said grinding of the second main surface of the semiconductor substrate, a multi-layered wiring layer is formed on the first main surface of the semiconductor substrate.

* * * * *